United States Patent
Mori et al.

(10) Patent No.: US 6,716,892 B1
(45) Date of Patent: Apr. 6, 2004

(54) URETHANE OLIGOMER, RESIN COMPOSITIONS THEREOF, AND CURED ARTICLE THEREOF

(75) Inventors: Satoshi Mori, Tokyo (JP); Minoru Yokoshima, Ibaraki (JP); Noriko Kiyoyanagi, Tokyo (JP); Yuichiro Matsuo, Saitama (JP); Hiroo Koyanagi, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/914,878
(22) PCT Filed: Mar. 15, 2000
(86) PCT No.: PCT/JP00/01567
§ 371 (c)(1), (2), (4) Date: Sep. 5, 2001
(87) PCT Pub. No.: WO00/56798
PCT Pub. Date: Sep. 28, 2000

(30) Foreign Application Priority Data

| Mar. 19, 1999 | (JP) | 11/074939 |
| Apr. 2, 1999 | (JP) | 11/096195 |
| Jul. 1, 1999 | (JP) | 11/187113 |
| Sep. 8, 1999 | (JP) | 11/254830 |

(51) Int. Cl.$^7$ ............ C08L 63/10; C08L 75/14; C08L 75/16; C08F 2/46; H05K 1/02
(52) U.S. Cl. ............ 522/92; 174/256; 428/209; 428/423.1; 428/901; 430/4; 430/5; 430/18; 522/90; 522/93; 522/95; 522/96; 522/174; 525/123; 525/127; 525/440; 525/453; 525/454; 525/455; 525/528; 525/529; 525/530; 525/531; 528/73; 528/75; 528/80; 528/84

(58) Field of Search ............... 522/90, 92, 93, 522/95, 96, 174; 525/123, 127, 440, 453, 454, 455, 528, 529, 530, 531; 528/75, 80, 84, 73; 428/209, 423.1, 901; 174/256; 430/4, 5, 18

(56) References Cited

U.S. PATENT DOCUMENTS

| 4,503,198 A | * | 3/1985 | Miyai et al. ............... 525/440 |
| 4,829,123 A | | 5/1989 | Shigematsu et al. ........... 525/28 |
| 4,935,535 A | * | 6/1990 | Chiang et al. ............... 560/26 |
| 5,059,655 A | * | 10/1991 | Martz et al. ............... 525/131 |
| 5,176,985 A | | 1/1993 | Seitz et al. ............... 430/284 |
| 5,182,355 A | * | 1/1993 | Martz et al. ............... 528/75 |

FOREIGN PATENT DOCUMENTS

| EP | 0 539 030 | 4/1993 |
| JP | 5-310871 | 11/1993 |
| JP | 6-206956 | 7/1994 |
| JP | 7-196764 | 8/1995 |
| JP | 8-165318 | 6/1996 |

* cited by examiner

*Primary Examiner*—Rabon Sergent
(74) *Attorney, Agent, or Firm*—Nields & Lemack

(57) ABSTRACT

The present invention relates to a new urethane oligomer (A) and a resin composition comprising (A) and an unsaturated group containing polycarboxylic acid resin (B) that can be diluted with water and is excellent in providing a cured product and that is suitable for a solder resist and an interlayer dielectric layer because the cured product is excellent in flexibility, soldering-heat resistance or the like and allows a development with an organic solvent or a dilute alkali solution; a photosensitive resin composition suitable for an etching resist or a cover lay; and a photosensitive film obtained thereby.

15 Claims, No Drawings

URETHANE OLIGOMER, RESIN COMPOSITIONS THEREOF, AND CURED ARTICLE THEREOF

TECHNICAL FIELD

The present invention relates to a water-soluble resin and a resin composition that are ready to be cured by active energetic ray, and a cured article thereof. The present invention is applicable for a coating agent, a printing ink, a photoresist, a adhesive and an printing material.

BACKGROUND OF ART

For promoting energy conservation or VOC prevention. active energetic ray such as ultraviolet ray has widely been applied for a plastic curing technology. As the VOC prevention recently asks the solubillzation of plastics, so a suitable water-soluble resin is especially desired to develop.

For manufacturing a printed circuit board, a liquid or film state of photosensitive resin composition has been used. For example, the composition is used as a resist to etching the copper foil of a copper laminated layer board, serving for the limitation of soldering positions and the protection of circuits on the printed circuit board. There is a film state of printed circuit board, called the FPC (the flexible printed circuit board), which is able ready to pack in a folding way inside a small machine such as a camera. The FPC also needs a resist, called a cover lay or a cover coat, to serve for the limitation of soldering positions and the protection of circuits on the printed circuit board. The cover lay is formed on the FPC by thermal pressure after the polyimide or the polyester having an adhesive layer is punched out into a designated shape. The cover coat is formed by printing and curing a thermosetting or photosetting ink.

For the resist to use for the limitation of soldering positions and the protection of circuits in FPC, a polyimide cover lay having excellent flexibility is often applied because the flexibility is the especially important property. The cover lay, however, needs a high-priced metal mold for punching out and a manual work for bonding the punched-out films, together with the adhesive agent projected out, causing a low production yield and a high production cost. The drawback makes it difficult to promote the FPC market and to cope with the recent high-density technology.

On the background art, it has been desired to provide a photosensitive resin composition, especially a photosensitive film to form a cover lay that has excellently a high precision and a high reliability in size precision and in resolving power for a photographic development (a means for picturing an image by developing succeeding to an imaging exposure). A photosensitive resin composition for forming a soldering mask was attempted to apply for the object. The composition included a photosensitive resin composition that contained an acrylate polymer and a photopolymerizable monomer as the main component (JP Laid-Open No. 56018/1978, JP Laid-Open No.1018/1979); a good heat-resistant photosensitive resin composition that contained a photosensitive epoxy resin having chalcone groups on the main chain and an epoxy resin-curing agent as the principal component (JP Laid-Open No.82073/1979, JP Laid-Open No.62636/1983); a composition that contained a novolac type of epoxy acrylate having epoxy groups and a photopolymerization initiator as the principal component (JP Laid-Open No.272/1986); and a photosensitive resin composition for forming a soldering mask that was ready to develop in an excellently safe and economical alkaline solution, containing a polymer having calboxylate groups, a monomer, a photopolymerization initiator and a thermosetting resin as the principal component (JP Laid-Open No.73148/1973, JP Laid-Open No.178237/1982, JP Laid-Open No.42040/1983, JP Laid-Open No.151152/1984). Any composition of them, however, had insufficient flexibility.

The present invention is intended to solve the above problem, that is, to provide a resin and a resin composition that is water-soluble and is ready to cure by active energetic ray. The resin and the resin composition thereof of the present invention can be diluted or dispersed with water to use, can be easily washed with water from a painting or irradiating set, or can be applied to a photoresist for developing in water or an aqueous alkaline solution.

The present invention also relates to a resin composition, a photosensitive film thereof, and a cured product thereof that are useful for a printed circuit board, more particularly to a resin composition and a photosensitive film thereof that are useful for the soldering resist for a flexible printed circuit board, the plating resist, and the interlayer dielectric material for a multi-layer printed circuit board, have excellent power for development, and can provide a cured product coated with an excellently adhesive, flexible (bendable), soldering heat-resistant, chemical resistant and gold plating-resistant surface membrane; and the cured product.

The present invention, if applied for a photoresist, is intended to provide a resin composition that can cope with the present high-density technology of a printed circuit, is excellent in photosensitivity to active energetic ray and is good to deal with, enabling to form a minute image through light exposure and development done in an organic solvent, water, or an aqueous dilute alkaline solution; a photosensitive film thereof; and a cured product thereof. The resin composition also can form the cured membrane by thermosetting in the post-curing process which is excellent in flexibility, soldering heat-resistance, heat deterioration-resistance, nonelectrolytic gold plating-resistance, acid resistance, and water resistance. Therefore, the composition may be suitable for the resist ink for developing in an organic solvent, water, or an aqueous alkaline solution, especially for a flexible printed circuit board.

DISCLOSURE OF THE INVENTION

The present invention relates to the following items:

(1) An urethane oligomer (A) obtained by reacting a polyol compound(a) with a polybasic acid anhydride (b-1) having at least two acid anhydride groups per molecule, a polyisocyanate compound(c), and a hydroxy compound having ethylenically unsaturated groups and the salt thereof.

(2) An urethane oligomer (A) according to the above (1), wherein said polybasic acid anhydride(b) having at least two acid anhydride groups per molecule has an acid value of 200–1500 mgKOH/g, and the salt thereof.

(3) An urethane oligomer (A) according to the above (1) or (2), wherein said urethane oligomer (A) has a weight-average molecular weight of 1,000–100,000, and the salt thereof.

(4) An urethane oligomer (A) according to any of the above (1) to (3), wherein said urethane oligomer (A) has an acid value of 1–200 mgKOH/g; and the salt thereof.

(5) A resin composition comprising an urethane oligomer (A) according to any of the above (1) to (4) and an unsaturated group-containing polycarboxylic acid resin (B) that is a product obtained by reacting an epoxy resin (e) having at least two epoxy groups per molecule with a monocarboxylic acid compound(f) having ethylenically unsaturated groups and a polybasic acid anhydride(b-2).

(6) A resin composition according to the above (5), wherein said epoxy resin (e) having at least two epoxy groups per molecule is represented by Formula (1):

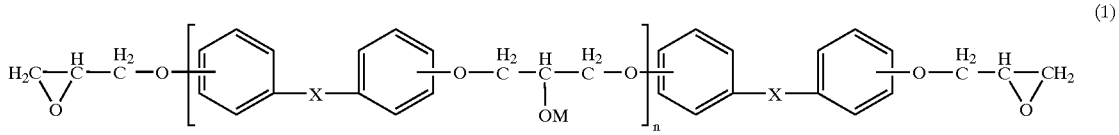

(In the formula, X is —CH$_2$— or —C(CH$_3$)$_2$—, n is an integer of 1 or more, and M is hydrogen or a group represented by Formula (G) as shown below:

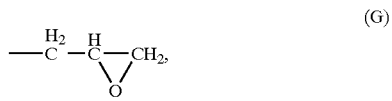

provided that M is a group represented by Formula (G) if n is 1, while at least one M is a group represented by Formula (G) and the remainders being hydrogen if n is an integer more than 1).

(7) A resin composition comprising an urethane oligomer (A) according to any of the above (1) to (4) and a thermoplastic polymer(D).

(8) A resin composition according to the above (5) or (6). further comprising a diluent(C).

(9) A resin composition according to the above (7) or (8), wherein said diluent(C) is a reactive diluent(C-1).

(10) A resin composition according to any of the above (5) to (9), comprising a photopolymerization initiator(E).

(11) A resin composition comprising an urethane oligomer(A) according to any of the above (1) to (4), a thermoplastic polymer(D) and a photopolymerization initiator(E).

(12) A resin composition according to the above (11), wherein. said thermoplastic polymer(D) is a polymer having carboxyl groups.

(13) A resin composition according to any of the above (1) to (10), comprising a thermosetting component(F).

(14) A resin composition according to any of the above (5) to (13), wherein said resin composition is prepared for the solder resist in a printed circuit board or for an interlayer dielectric layer.

(15) A photosensitive film comprising being prepared by laminating the layer of a resin composition according to any of the above (10) to (14) on a supporting film.

(16) A photosensitive film according to the above (15), wherein said photosensitive film is prepared for a printed circuit board.

(17) A cured product of the resin composition according to any of the above (5) to (16).

(18) An article comprising having the layer of a cured product according to the above (17).

(19) An article according to the above (18), wherein said article is a printed circuit board.

(20) A two-liquid type of resin composition set comprising: a principal resin composition which contains (1) an urethane oligomer (A) or the salt thereof, (2) either an unsaturated group-containing polycarboxylic acid resin (B) or a thermoplastic polymer (D), and (3) a photopolymerization initiator(E) and a curing agent composition which contains a thermosetting component(F).

Best Mode for Carrying Out the Invention

The urethane oligomer (A) of the present invention can be obtained in a following way: A polyol compound(a) is reacted with a polybasic acid anhydride(b-1) having at least two anhydride groups per molecule and a polyisocyanate compound (c) to get a carboxyl group-containing urethane prepolymer having isocyanate at the terminal end, which is then reacted with an ethylenically unsaturated group-containing hydroxy compound(d) to obtain the utrethane oligomer. The urethane oligomer(A) has preferably a molecular weight of 1.000–100,000 and has preferably an acid value of 1–200 mgKOH/g.

The polyol compound(a) to use for a starting material includes alkyl polyol, polyester polyol, polyether polyol, acryl polyol, polybutadiene polyol, phenolic polyol and/or a nonflammable polyol.

The alkyl polyol in the polyol compound (a) is generally an about C1–C10 aliphatic hydrocarbon substituted with about 2–6 hydroxy groups and includes 1,4-butane-diol, to 1,6-hexane-diol, 1,8-octane-diol, neopentyl glycol, cyclohexane-dimethanol, trimethylol-propane, and pentaerythritol.

The polyester polyol in the polyol compound (a) includes a condensed polyester polyol, an addition polymerization polyester polyol and a polycarbonate polyol. The condensed polyester polyol includes the above alkyl polyol, preferably a polyester polyol having a molecular weight of about 100–100,000 that can be obtained by the condensation of a diol compound and an organic polybasic acid. The diol compound to use for the condensation includes a C1–C20, preferably about C2–C10 aliphatic glycol or a polyalkylene glycol derived from the aliphatic glycol and bound by ether bond such as ethylene glycol, propylene glycol, diethylene glycol, 1,4-butane-diol, neopentyl glycol, 1,6-hexane-diol, 3-methyl-1,5-pentane-diol, 1,9-nonane-diol, 1,4-hexane-dimethanol, dimeric acid diol; and a poly(C1–C4)alkylene glycol such as polyethylene glycol. The organic polybasic acid to use for the condensation includes a C1–C30, preferably C2–C20 aliphatic or aromatic carboxylic acid substituted with about 2–4 carboxyl groups such as adipic acid, isophthalic acid, terephthalic acid and sebacic acid.

The addition polymerization polyester polyol in the polyol compound (a) includes polycaprolacton and has preferably a molecular weight of 100–100,000. Polycarbonate polyol can be synthesized by the direct phosgenation of a polyol or the ester interchange with diphenyl carbonate and has preferably a molecular weight of 100–100,000.

The polyether polyol in the polyol compound (a) includes a polyalkylene polyol having C2–C4 alkyl groups such as a PEG (polyethylene glycol) family polyol, a PPG (polypropylene glycol) family polyol, and a PTG (polytetramethylene glycol) family polyol. The PEG family polyol includes a polyethylene glycol obtained by the addition molymerization of ethylene oxide using metal sodium or anhydrous potassium hydroxide for the polymerization initiator and has preferably a molecular weight of 200–100,000. The PPG family polyol includes a polypropylene glycol obtained by the addition molymerization of propylene oxide using the above active hydrogen-containing compound for the polymerization initiator and has preferably a molecular weight of 100–100,000. The PTG family polyol includes a polytetramethylene glycol synthesized by the cationic molymerization of tetrahydrofuran and has preferably a molecular weight of 100–100,000. The other polyether polyol includes the ethylene oxide adduct or the propylene oxide adduct of bisphenol A and has preferably a molecular weight of 100–100,000.

The other polyol in the polyol compound (a) includes the (meth)acryl polyol that is a copolymer of a hydroxyl group-containing (meth)acrylic acid ester and the other (meth)acrylic acid ester; the polybutadiene polyol that is a to homo- or co-polymer of butadiene having a hydroxyl group at the terminal end; the phenolic polyol having phenol molecules in the molecules; epoxypolyol; and a nonflammable polyol having phosphorus, a halogen atom etc, and has preferably a molecular weight of 100–100,000. These polyols may be used alone or in the combination of two or more of them.

The preferable examples of the above polyols are a C2–C4 alkylene glycol, more preferably ethylene glycol and a poly (C2–C4) alkylene glycol, more preferably tetramethylene glycol. The polyol has preferably a hydroxyl group value of 20–200 mgKOH/g, more preferably of 50–150 mgKOH/g and has preferably a molecular weight of about 300–5,000, more preferably of about 400–2,000.

The polybasic acid anhydride(b-1) having at least two acid anhydride groups has preferably an acid value of 200–1,500 mgKOH/g, more preferably of 500–1,300 mgKOH/g. The acid anhydride includes the anhydride of a C4–C30 aliphatic carboxylic acid having four or more carboxyl groups and an aromatic carboxylic acid having 1–3 benzene ring which has four or more carboxyl groups, where the two or more benzene rings may be condensed or bonded each other directly or through a bridge group. The intermediating bridge group includes oxygen. sulfur, sulfonyl, and a C1–C3 alkylene group. The polybasic acid anhydride includes pyromellitic acid anhydride, benzophenone tetracarboxylic acid dianhydride, biphenyl tetracarboxylic acid dianhydride, biphenylether tetracarboxylic acid dianhydride, diphenyl sulfone tetracarboxylic acid dianhydride, butane tetracarboxylic acid dianhydride, and ethylene glycol bis(anhydrotrimellitate). These may be used alone or in the combination of 2 or more.

The polyisocyanate compound(c) includes preferably a C3–C15 aliphatic or C6–C15 aromatic di- or tri-isocyanate such as 2,4-and/or 2,6-tolylene diisocyanate, 4,4'-diphenylmethane diisocyanate(MDI), polymeric MDI, 1,5-naphthylene diisocyanate, tridine diisocyanate, 1,6-hexamethylene diisocyanate, trimethyl hexamethylene diisocyanate, isophorone diisocyanete, xylilene diisocyanate (XDI), hydrogenated XDI, hydrogenated MDI, lysine diisocyanate, triphenylmethane triisocyanate, and tris(isocyanatephenyl) thiophosphate. The aliphatic polyisocyanate may be branched and have a substituent such as carboxyl. The aromatic isocyanate may have two or more benzene rings which are condensed or bonded each other directly or through a bridge group, as in thek above description of polybasic acid anhydride. These polyisocyanate compounds may be used alone or in the combination of 2 or more. A C5–C9 aliphatic diisocyanate that may have carboxyl as the substituent and a lower alkyl-substituted phenyldiisocyanate are preferable. A phenyldiisocyanate substituted with 1–2 methyl groups is more preferable.

The word "lower" as used in "lower alkyl" for example means C1–C6, preferably C1–C4, more preferably C1–C3 in the present invention.

The ethylenically unsaturated group-containing hydroxy compound (d) is preferably an acrylate group-containing hydroxy compound. The preferable acrylate group-containing hydroxy compound is a C1–C30, preferably C2–C6'alkyl mono- or poly-(meth)acrylate having 1–3 hydroxy groups, and is especially preferably a monohydroxy lower alkylacrylate. The acrylate group-containing hydroxy compound usable in the present invention includes 2-hydroxyethyl (meth)acrylate, 2-hydroxypropyl (meth)acrylate, glycidol di(meth)acrylate, caprolactone denatured 2-hydroxyethyl (meth)acrylate. pentaerythritol tri(meth)acrylate, and glycerol diacrylate, These may be used alone or in the combination of two or more. The word "(meth)acrylate" means any one of acrylate and methacrylate in the present invention.

The urethane oligomer (A) of the present invention can be produced by a process as described below for example.

The polyol compound (a) is reacted with the polybasic acid anhydride (b-1) to produce the terminal alcohol compound (hereinafter called a carboxyl group-containing terminal alcohol compound) having at least two carboxyl groups, which is then reacted with the polyisocyanate compound (c) to get a carboxyl group-containing terminal isocyanate urethane prepolymer. The urethane prepolymer thus obtained is reacted with the ethylenically unsaturated group-containing hydroxy compound (d) to obtain the urethane oligomer (A) of the present invention.

The polyol compound (a) is preferably reacted with the polybasic acid anhydride (b-1) in such a rate that the amount (equivalent) of the acid anhydride group of the latter (b-1) is 0.5–0.99 equivalent per 1 equivalent of hydroxy group of the former (a). This esterification can be carried out by a publicly known method, preferably at a reaction temperature of 60–150° C. and for a reaction time of 1–10 hours. An amine compound such as triethylamine may be added at 0.1–5% for the reaction catalyst.

The reaction for obtaining the carboxyl group-containing terminal isocyanate urethane prepolymer is preferably carried out in such a rate that the isocyanate group of the polyisocyanate compound is 1.1–2.1 equivalent per 1 equivalent of hydroxy group of the carboxyl group-containing terminal alcohol compound as obtained above. The reaction for prepolymerizing is generally carried out at a room temperature –100° C. preferably at 50–90° C.

To obtain the urethane oligomer (A) of the present. invention, the above terminal isocyanate urethane prepolymer is preferably reacted with the ethylenically unsaturated. group-containing hydroxy compound (d) in such a rate that the hydroxy group of the hydroxy compound (d) (preferably, hydroxyalkyl(meth)acrylate) is 0.9–1.5 equivalent per 1 equivalent of isocyanate group of the prepolymer. The especially preferable rate is 1.0–1.1.

The last reaction step for obtaining the urethane oligomer (A) is generally carried out at a room temperature –100° C., preferably at 50–90° C. It is desirable that a polymerization inhibitor such as hydroquinone, hydroquinone monomethyl ether, p-methoxyphenol and p-benzoquinone is generally added at 50–2,000 ppm to prevent gelatinization by radical polymerization. A catalyst such as triethylamine, dibutyl tin laurate and dibutyl tin diacetate, preferably dibutyl tin laurate, may be added in the reaction system, though the hydroxy group can be reacted with the isocyanate group even in the absence of a catalyst.

The reactive diluent (C-1) and/or the non-reactive diluent (C-2) as described below may be used for a diluent (C) while the reaction lasts or after it ends.

The non-reactive diluent (C-2) includes an aromatic hydrocarbon such as toluene and xylene; an ester such as ethyl acetate and butyl acetate; an ether such as 1,4-dioxane and tetrahydrofuran; a ketone such as methyl ethyl ketone and methyl isobuyl ketone; a glycol deravative such as butyl cellosolve acetate, carbitol acetate, diethylene glycol dlmethyl ether and propylene glycol monomethyl ether acetate; an alicyclic hydrocarbon such as cyclohexanone and cyclohexanol; and a petroleum solvent such as petroleum ether and petroleum naphtha. These may be used alone or in the combination of two or more.

The carboxyl group of the urethane oligomer (A) can be neutralized with a basic compound to change into the salt of the urethane oligomer (A) (The salt is called "a water-soluble urethane oligomer (A')" hereinafter).

The basic compound to use for preparing the salt of the urethane oligomer (A) includes a tertiary amine such as triethylamine, N,N-dimethylbutylamine, tributylamine, triallylamine, N,N-dimethylallylamine, N-methyldiallylamine, N,N-dimethylethanolamine, N,N-diethylmethanolamine, N,N-dibutylethanolamine, N,N-dimethylpropanolamine, N-methyldiethanolamine, N-ethyldiethanolamine, triethanolamine, N-methylmorpholine and N-ethylmorpholine; an alkali metal hydroxide such as sodium hydroxide and potassium hydroxide; and an alkali metal carbonate such as sodium carbonate and potassium carbonate. These basic compounds may be used alone or in the combination of two or more. An aqueous solution of the basic compound is preferably added to the urethane oligomer (A) dropwise under stirring to neutralize.

The unsaturated group-containing polycarboxylic acid resin (B) used in the resin composition of the present invention is a reaction product of the epoxy resin (e) having two or more epoxy groups per molecule, the ethylenically unsaturated group-containing monocarboxylic compound (f) and the polybasic acid anhydride (b-2).

The epoxy resin (e) having two or more epoxy groups per molecule to use for preparing the unsaturated group-containing polycarboxylic acid resin (B) includes a glycidyl ether such as an epoxy resin represented by Formula (1) as shown above, a bisphenol A type epoxy resin, a bisphenol F type epoxy resin, a phenol novolac type epoxy resin, a cresol novolac type epoxy resin, a trisphenol methane type epoxy resin, a brominated epoxy resin and biphenol type epoxy resin; an alicyclic epoxy resin such as 3,4-epoxy-6-methylcyclohexylmethyl-3,4-epoxy-6-methylcyclohexane carboxylate, 3,4-epoxycyclohexylmethyl-3,4-epoxycyclohexane carboxylate, and 1-epoxyethyl-3,4-epoxycyclohexane; a glycidyl ester such as phthalic acid diglycidyl ester, tetrahydrophthalic acid diglycidyl ester, and dimeric acid glycidyl ester; a glycidylamine such as tetraglycidyl diaminodiphenyl methane; and a heterocyclic epoxy resin such as triglycidyl isocyanurate. The epoxy resin represented by Formula (1) is preferable. The n in Formula (1) is calculated from an equivalents of the epoxy and is generally about 1–20, preferably about 1–15.

The epoxy resin (e) represented by Formula (1) can be obtained by reacting the alcoholic hydroxyl group of the epoxy compound for a raw material where M is hydrogen in Formula (1) with an epihalohydrin such as epichlorohydrin. The epoxy compound for a raw material is available on the market and includes a bisphenol A type epoxy resin such as EPICOAT series (trade name: EPICOAT 1009, 1031, made by Yuka Shell Epoxy KK), EPICLON series(trade name: EPICLON N-3050, N-7050, made by DAINIPPON INK AND CHEMICALS, INC.), and DER series(trade name: DER-642U, DER-673MF, made by Dow Chemical KK); and a bisphenol F type epoxy resin such as YDF series (trade name: YDF-2004, 2007, made by Tohto Kasei KK).

The epoxy compound for a raw material is preferably reacted with the epihalohydrin under the presence of dimethylsulfoxide. The epihalohydrin may be used in the amount of 1 equivalent or more per 1 equivalent of alcoholic hydroxy group of the epoxy compound for a raw material. However, even if 15 equivalent or more per 1 equivalent of alcoholic hydroxy group are used, it provides little effect or rather brings about a bad capacity efficiency. The quantity of the alcoholic hydroxide can be determined by a conventional method such as the titration method and the IR method. However it is usually calculated from equivalents of the epoxy.

An alkali metal hydroxide is usually used for carrying out the above reaction. The alkali metal hydroxide includes sodium hydroxide, potassium hydroxide, lithium hydroxide, and calcium hydroxide. Sodium hydroxide is preferable. The alkali metal hydroxide is satisfactorily used in the amount of about 1 equivalent per 1 equivalent of alcoholic hydroxy group to epoxidate of the compound represented by Formula (2). It may be excessively used for epoxidating all the alcoholic hydroxy groups of the compound represented by Formula (2). However, the use in the amount of 2 or more equivalent of the hydroxide per 1 equivalent of alcoholic hydroxy group have a tendency to polymerize a little.

The reaction temperature is preferably 30–100° C. The temperature lower than 30° C. slows down the reaction to need a long time for completing. The temperature higher than 100° C. is undesirable because it causes many side reactions. After the reaction ends, epihalohydrin and dimethyl sulfoxide in surplus are distilled out under reduced pressure. If necessary, the produced resin can be dissolved in an organic solvent and then be submitted to the dehydrohalogenation with an alkali metal hydroxide.

The ethylenically unsaturated group-containing monocarboxylic acid compound (f) to use for preparing the unsaturated group-containing polycarboxylic resin (B) includes (meth)acrylic acid and an acrylic acid dimmer. (Meth)acrylic acid is preferable.

To prepare the above unsaturated group-containing polycarboxylic resin (B), it is preferable that the epoxy resin (e) is reacted with the ethylenically unsaturated group-containing monocarboxylic acid compound (f) to obtain an epoxy (meth)acrylate compound, which is then reacted with a polybasic acid anhydride(b-2).

The epoxy resin (e) is preferably reacted with the ethylenically unsaturated group-containing monocarboxylic acid compound (f) in such a way that the quantity of the carboxyl group of the component (f) is 0.3–1.2 equivalent, especially preferably 0.9–1.05 equivalent per 1 equivalent of epoxy group of the epoxy resin.

The reactive diluent (C-1) and/or the non-reactive diluent (C-2) as described below may be used while the reaction lasts or after it ends.

The non-reactive diluent (C-2) includes an aromatic hydrocarbon such as toluene and xylene; an ester such as ethyl acetate and butyl acetate; an ether such as 1,4-dioxane and tetrahydrofuran; a ketone such as methyl ethyl ketone and methyl isobuyl ketone; a glycol deravative such as butyl cellosolve acetate, carbitol acetate, diethylene glycol dimethyl ether and propylene glycol monomethyl ether acetate; an alicyclic hydrocarbon such as cyclohexanone and cyclohexanol; and a petroleum solvent such as petroleum ether and petroleum naphtha. These may be used alone or in the combination of two or more.

For accelerating the reaction, a catalyst is preferably used. The catalyst includes triethylamine, benzylmethylamine, methyl triethylammonium chloride, triphenyl stibine, and triphenyl phosphine. The catalyst is preferably used in an amount of 0.1–10% by weight, especially preferably of 0.3–5% by weight relative to a mixture of the reacting materials.

For preventing the ethylenically unsaturated groups from polymerizing during the reaction a polymerization inhibitor is preferably used. The polymerization inhibitor includes methoquinone, hydroquinone, methyl hydroquinone, and phenothiazine. The inhibitor is preferably used in an amount of 0.01–1% by weight, especially preferably of 0.05–0.5% by weight relative to a mixture of the reacting material. The reaction temperature is 60–150° C., especially preferably 80–120° C. The reaction time is preferably 5–60 hours.

The epoxy (meth)acrylate compound as obtained above can be reacted with the polybasic acid anhydride (b-2) to obtain the above unsaturated group-containing polycarboxylic acid resin (B).

For the polybasic acid anhydride (b-2) to use for the reaction, those as described in the paragraph of a polybasic acid anhydride (b-1) having at least two acid anhydride groups can be used. However, a polybasic acid anhydride having one acid anhydride group is preferably used. For the polybasic acid anhydride, the acid anhydride of a C1–C20, preferably C2–C7 aliphatic hydrocarbon (saturated, unsaturated, or cyclic) substituted with two carboxyl groups or the acid anhydride of a C6–C10 aromatic dicarboxylic acid is preferable. The acid anhydride of a C2–C4 aliphatic hydrocarbon is more preferable.

The preferable polybasic acid anhydride (b-2) includes succinic anhydride, maleic anhydride, itaconic anhydride, tetrahydophthalic anhydride, hexahydrophthalic anhydride, 3-methyl-tetrahydrophthalic anhydride, and 4-methyl-hexahydrophthalic anhydride. The polybasic acid anhydride is used in such an amount that 0.05–1.00 equivalent of the anhydride may be reacted with 1 equivalent of the hydroxy group in the above epoxy (meth)acrylate. The reaction temperature is 60–150° C., especially preferably 80–100° C.

The thermoplastic polymer (D) to use for the resin composition of the present invention will be described below.

For the thermoplastic polymer (D), a (meth)acryl resin. a polyester resin, a vinyl acetate resin, a vinylchloride vinylacetate copolymer, a polyurethane resin and polybutadiene for example can be used. The polymer includes the polymer or the copolymer of a monomer such as a C1–C8 alkyl (meth)acrylate that may have a substituent such as mono- or di-lower alkylamino group or hydroxy group, such as acrylic acid, methacrylic acid, methyl methacrylate, butyl methacrylate, 2-ethylhexyl methacrylate, lauryl methacrylate, ethyl acrylate, methyl acrylate, 2-hydroxyethyl methacrylate, 2-hydroxyethyl acrylate, 2-hydroxypropyl methacrylate, 2-hydroxypropyl acrylate, dimethylaminoethyl methacrylate, dimethylaminoethyl acrylate and etc.; a styrene compound that may have a lower alkyl substituent, such as styrene, α-methylstyrene, vinyl toluene and etc. N-vinylpyrrolidone, acrylamide and (meth) acrylonitrile; and the half-ester of styrene-maleic acid copolymer. These may be used alone or in the combination of two or more. Of these thermoplastic polymers (D), some have carboxyl groups and the others do not have. The polymer having carboxyl groups is preferable. The copolymer of (meth)acrylic acid with a C1–C8 alkyl (meth)acrylate that may have a substituent such as hydroxy group is more preferable.

The component of (D) (the thermoplastic polymer) has preferably a weight-average molecular weight of 10,000–300,000. A weight-average molecular weight of lose than 10,000 possibly makes it difficult for the component to form a film, while that of more than 300.000 possibly brings about a bad development. A carboxyl group content of the component (D) may be of 0% by mol, and preferably of 50% by mol or less. The content is preferably 3% by mol or more, more preferably of 5% by mol or more, further more preferably of 10% by mol or more and, as the case may be, 15% by mol or more. A carboxyl group content of more than 50% by mol possibly makes it difficult for the component to form a pattern. Therefore, the content is preferably 45% by mol or less, more preferably 35% by mol or less, and further more preferably 25% by mol or less. The carboxyl group content generally depends upon the rate of a carboxyl group-containing monomer used. Even if the rate is not clear, the carboxyl group content can be determined by a conventional method such as titration method and IR method. The component (D) is preferably soluble or sellable in an aqueous alkali solution.

The reactive diluent (C-1) used in the present invention includes a C2–C6 aliphatic amide having vinyl and various kinds of (meth)acrylates. These may be used alone or in the combination of two or more.

The C2–C6 aliphatic amide having vinyl includes a N-vinylcyclic amide of 5–8 membered ring such as N-vinylpyrrolidone and N-vinylcaprolactone, and a (meth) acrylamide obtained by condensing a nitrogen-containing 4–6 membered heterocyclic compound with (meth)acrylic acid such as acroyl morpholine. Acroyl morpholine is preferable.

Various kinds of (meth)acrylates to use for the reactive diluent (C-1) are classified into a monofunctional(meth) acrylate compound and a polyfunctional(meth)acrylate compound.

The monofunctional(meth) acrylate compound to use for the reactive diluent (C-1) is a compound having one acrylate group, including a monoester of (meth) acrylic acid that may have substituent(s) with a C1–C10 aliphatic alcohol that may have substituent(S): phenoxyethyl (meth)acrylate, benzyl (meth)acrylate, cyclohexyl (meth)acrylate, phenyloxyethyl oxyethyl (meth)acrylate, isobornyl (meth)acrylate, 2-ethylheyl (meth)acrylate, stearyl (meth)acrylate, tetrahydrofurfuryl (meth)acrylate, caprolactone denatured tetrahydrofurfuryl (meth)acrylate, lauryl (meth)acrylate, isodecyl (meth)acrylate, tridecyl (meth)acrylate, dicyclopentenyl (meth)acrylate, dicyclopentenyloxyethyl (meth)acrylate, carbitol (meth)acrylate, acryloyl morpholine, nonylphenoxy polyethylene glycol (meth)acrylate, nonylphenoxy polypropylene glycol (meth)acrylate, and a half-ester obtained by reacting a hydroxyl group-containing (meth)acrylate with the acid anhydride of a polycarboxylic acid compound. For the hydroxyl group-containing (meth)acrylate to use for preparing the half-ester, the acrylate as described in the paragraph of the ethylenically unsaturated group-containing hydroxy compound (d) can be used and includes 2-hydroxyethyl (meth)acrylate, 2-hydroxypropyl (meth) acrylate, and 1,4- butane-diol mono(meth)acrylate. For the acid anhydride of a polycarboxylic acid compound to use for preparing the half-ester, the polybasic acid anhydride as described in the paragraph of the polybasic acid anhydride (b-2) can be used and includes succinic anhydride, maleic anhydride, phthalic anhydride, tetrahydrophthalic anhydride, and hexahydrophthalic anhydride for preferable examples.

The polyfunctional acrylate compound to use for the reactive diluent (C-1) is a compound having two or more acrylate group and includes ethylene oxide denatured bisphenol A di(meth)acrylate, propylene oxide denatured bisphenol A di(meth)acrylate, ethylene oxide denatured bisphenol F di(meth)acrylate, 1,4-butane-diol di(meth) acrylate, dicyclopentanyl di(meth)acrylate, hydroxypivalic acid neopentyl glycol di(meth)acrylate, caprolactone denatured hydroxypivalic acid neopentyl glycol di(meth) acrylate, polyethylene glycol di(meth)acrylate, tripropylene glycol di(meth)acrylate, neopentyl glycol di(meth)acrylate, trimethylol propane tri(meth)acrylate, trimethylol propane polyethoxy tri(meth)acrylate, glycerin polypropoxy tri (meth)acrylate, pentaerythritol tetra(meth)acrylate, the poly (meth)acrylate of a reaction product of dipentaerythritol with ε-caprolactone, dipentaerythritol poly(meth)acrylate, and epoxy(meth)acrylate, namely the reaction product of a mono- or poly-glycidyl compound with (meth)acrylic acid. The mono- or poly-glycidyl compound includes butyl glycidyl ether, phenyl glycidyl ether, polyethylene glycol diglycidyl ether, polypropylene glycol diglycidyl ether, 1,6-hexane-diol diglycidyl ether, hexahydrophthalic acid diglycidyl ester, glycerin polyglycidyl ether, glycerin polyethoxy glycidyl ether, trimethylol propane polyglycidyl ether, and trimethylol propane polyethoxy polyglycidyl ether.

The preferable compound includes a C3–C10 aliphatic polyalcohol poly(meth)acrylate having 2–4 hydroxyl groups; the diacrylate of a C2–C10 glycol diglycidyl ether; and a poly lower-alkylene glycol diacrylate, such as polyethylene glycol diacrylate, the diacrylate or the trimethylol propane tri(meth)acrylate of 1,6-hexane-diol diglycidyl ether, dipentaerythritol poly(meth)acrylate, and the poly (meth)acrylate of the reaction product of dipentaerythritol with ε-caprolactone.

For the other (meth)acrylate in the resin composition of the present invention, a polyester (meth)acrylate or a polybutadiene (meth)acrylate may be used. The polyester (meth) acrylate includes a condensate of the polyol compound as described in the above paragraph of the polyol compound (a) with (meth)acrylic acid. The polybutadiene (meth)acrylate includes a condensate of a liquid polybutadiene compound having terminal hydroxyl group with (meth)acrylic acid; and a compound obtained by reacting a liquid polybutadiene compound having terminal hydroxyl group with the above polyisocyanate compound and then reacting with a ethylenically unsaturated group-containing hydroxy compound as described in the above paragraph of the ethylenically unsaturated group-containing hydroxy compound (d).

The photopolymerization initiator (E) used in the present invention includes a benzoin such as benzoin, benzoin methylether, benzoin ethylether, benzoin propylether and benzoin isobutyl ether; an acetophenone such as acetophenone, 2,2-dimethoxy-2-phenylacetophenone, 2,2-diethoxy-2-phenylacetophenone, 1,1-dichloroacetophenone, 2-hydroxy-2-methyl-1-phenylpropane-1-one, diethoxy acetophenone, 1-hydroxycyclohexyl phenyl ketone, and 2-methyl-1-(4-(methylthio)phenyl)-2-morpholino-propane-1-one; an anthraquinone such as 2-ethyl anthraquinone, 2-tertiary-butylanthraquinone, 2-chloroanthraquinone, 2-amylanthraquinone; a thioxanthone such as 2,4-diethyl thioxanthone, 2-isopropylthioxanthone, 2-chlorothioxanthone; a ketal such as acetophenone dimethyl ketal, benzyl dimethyl ketal; a benzophenone such as benzophenone, diethylaminobenzophenone, 4,4-bismethylaminobenzophenone; and 2,4,6-trimethylbenzoyl-diphenylphosphine oxide. These may be used alone or in the combination of two or more. Furthermore, these may be used in the combination with an accelerator including a tertiary amine such as triethanolamine and metyldiethanolamine; and a benzoic acid derivative such as N,N-dimethylaminobenzoic acid ethylester and N,N-dimethylaminobenzoic acid isoamylester.

The thermosetting component (F) used in the present invention can make the resin composition a material for preparing the printed circuit board that is excellent in soldering heat-resistance and electrical property. The thermosetting component (F) is not limited to a specific one, as long as it has intramolecularly a functional group that can react with the unsaturated group-containing polycarboxylic acid resin (B), the urethane oligomer (A) and the thermalplastic polymer (D) to cure thermally. The functional group includes epoxy, melamino-amino, ureido, oxazolyl, andphenolic hydroxy.

The thermosetting component (F) Includes an epoxy resin, a melamine compound, an urea compound, an oxazoline compound, and a phenol compound. The epoxy resin includes a glycidyl ether such as a bisphenol A type epoxy resin, a bisphenol F type epoxy resin, a phenol novolac type epoxy resin, a cresol novolac type epoxy resin, a trisphenol methane type epoxy resin, a brominated epoxy resin, a bixylenol type epoxy resin and biphenol type epoxy resin; an alicyclic epoxy resin formed by the porimerization of a monomer such as 3,4-epoxy-6-methylcyclohexylmethyl-3, 4-epoxy-6-methylcyclohexane carboxylate, 3,4-epoxycyclohexylmethyl-3,4-epoxycyclohexane carboxylate, and 1-epoxyethyl-3,4-epoxycyclohexane; a glycidyl ester such as phthalic acid diglycidyl ester, tetrahydrophthalic acid diglycidyl ester, and dimeric acid glycidyl ester; a glycidylamine such as tetraglycidyl diaminodiphenyl methane; and a heterocyclic epoxy resin formed by the polymerization of a monomer such as triglycidyl isocyanurate. The epoxy resin having a melting point of 50° C. or more is preferable because it can form a photopolymerizing membrane that shows no tackiness, after drying.

The melamine compound for the thermosetting component (F) includes melamine, hexamethoxymelamine, and the melamine resin which is a polycondensate of melamine with formalin.

The urea compound includes urea and the urea resin which is a polycondensate of urea with formalin.

The oxazoline compound to use for the thermosetting component (F) includes 2-oxazoline, 2-metyl-2-oxazoline, 2-phenyl-2-oxazoline, 2,5-dimethyl-2-oxazoline, 5-methyl-2-phenyl-2-oxazoline and 2,4-diphenyloxazoline.

Among the above thermosetting components (F), the epoxy resin is preferable because it is excellent in reactivity with the carboxyl groups in the component of (A), (B) and (D), and has a good adhesion to copper.

The above thermosetting component (F) is suitably used in such an amount that the quantity of the functional group of the thermosetting components (F) is 0.2–3.0 equivalent mol per carboxyl group in the component of (A), (B) and (D). The quantity of the above functional group is preferably 1.0–1.5 equivalent mol causing the resin composition to get excellent soldering heat-resistance and electrical property for a printed circuit board.

If the epoxy resin is used for the above thermosetting component (F), an accelerator is preferably used for accelerating the reaction of the epoxy resin with the carboxyl groups in the component of (A), (B) and (D). The accelerator for curing the epoxy resin includes an imidazole compound such as 2-methylimidazole, 2-ethyl-3-methylimidazole, 2-undecylimidazole, 2-phenylimdazole, 1-cyanoethyl-2-ethylimidazole and 1-cyanoethyl-2-undecylimidazole; a triazine derivative such as melamine, guanamine, acetoguanamine, benzoguanamine, ethyldiaminotriazine, 2,4-diaminotriazine, 2,4-diamino-6-tolyltriazine and 2,4-diamino-6-xylyltriazine; an amine such as dicyandiamide, trimethylamine, triethanolamine, N,N-dimethyloctylamine, pyridine and m-aminophenol; and a polyphenol. These curing accelerators may be used alone or in their combination.

The above component (F) is preferably mixed in a resin composition immediately before applying to a printed circuit board, though it may be mixed beforehand. The procedure is as follows. An accelerator for curing the epoxy resin is incorporated in the components of (A) to (E) for the main part to prepare a primary resin composition solution. On the other hand, the component of (F) is used for a main part to prepare a curing agent composition. The two liquid type of solutions are preferably mixed just before applying. The curing agent composition containing the component (F) is preferably liquid. The component (F) may be beforehand diluted with the above non-reactive diluent (c-2) if necessary. The component (F), if it is solid, is preferably diluted into a liquid. The non-reactive diluent is about 0–50%, preferably about 0–40% in amount relative to the total amount of the curing agent composition containing the component of (F). The remainder is the component of (F).

Various kinds of additives may be added to the resin composition of the present invention to improve the properties if necessary. The additives include a filler such as talc, barium sulfate, calcium carbonate, magnesium carbonate, barium titanate, aluminum hydroxide, aluminum oxide, silica, and clay; a thixotrope agent such as aerosil; a pigment and a dyestuff such as phthalocyanine blue, phthalocyanine green, and titanium oxide; silicone; a fluoride type leveling agent or an antiforming agent; a polymerization inhibitor such as hydroquinone and hydroquinone monomethyl ether; a coupling agent; a plasticizer; a mold lubricant; an antioxidant; a light stabilizer; and a wax.

The above components of (A) to (F) can be combined in an optional rate to use in the present invention. The preferable combinations are described below for representative examples.

The First Combination:
    The urethane oligomer (A) and/or the water-soluble urethane oligomer (A'), the reactive diluent (C-1) and the photopolymerization initiator(E).
The Second Combination:
    The urethane oligomer (A), the unsaturated group-containing polycarboxylic acid resin (B), the diluent (C), the photopolymerization initiator(E) and the thermosetting component (F).
The Third Combination:
    The urethane oligomer (A), the diluent (C), the photopolymerization initiator(E) and the thermosetting component (F).

The Fourth Combination:
    The urethane oligomer (A), the diluent (C), the thermoplastic polymer (D), the photopolymerization initiator(E) and the thermosetting component (F).

Each rate relative to the total mass of the composition of the components used in the first composition is as follows:
 (1) The rate of the urethane oligomer (A) and/or the water-soluble urethane oligomer (A') are 10% by mass (same hereinafter, unless otherwise stated) or more, preferably 30% or more, more preferably 50% or more, and 97% or less, more preferably 90% or less.
 (2) The rate of the reactive diluent (C-1) are 3% or more, more preferably 6% or more, further more preferably 10% or more, and 85% or less, more preferably 60% or less, further more preferably 50% or less.
 (3) The rate of the photopolymerization initiator(E) are 0.1% or more, more preferably 0.2% or more, and 15% or less, more preferably 5% or less.

Each rate of the components used in the second composition is as follows:
 (1) The sum of the components of (A) and (B) is 10% or more, preferably 20% or more, more preferably 30% or more, and 90% or less, more preferably 80% or less, further more preferably 70% or less relative to the total mass of the composition. The ratio of (A) to (B) is 1–99:99–1, preferably 5–70:95–30.

The rate of the component of (C) has 3 parts or more, preferably 5 parts or more, more preferably 8 parts or more, and 300 parts or less, more preferably 100 parts or less, further more preferably of 40 parts or less relative to 100 parts of the sum of the components of (A) and (B) (by mass, same hereinafter, unless otherwise stated).

The rate of the component of (E) are 0.5 parts or more, preferably 2 parts or more, more preferably 4 parts or more, and of 20 parts or less, more preferably 15 parts or less, further more preferably 10 parts or less relative to 100 parts of the sum of the components of (A), (B), and (C).

The component of (F) is used in such a rate that the rate of the functional group of the component of (F) are 0.2–3.0 equivalent mol per carboxyl group existing on the components of (A) and (B).

Each rate of the components used in the third composition is as follows:
 (1) The rate of the urethane oligomer (A) has 10% or more, more to preferably 20% or more, further more preferably 300 of more, and 90% or less, more preferably 80% or less, further more preferably 70% or less relative to the total mass of the composition.
 (2) The rate of the diluent (C) has 2% or more, more preferably 3% or more, further more preferably 5% of more, and 60% or less, more preferably 50% or less, further more preferably 15% or less relative to the total mass of the composition.
 (3) The rate of the photopolymerization initiator (E) has 0.5 parts or more, preferably 2 parts or more, more preferably 4 parts or more, and 20 parts or less, more preferably 15 parts or less relative to 100 parts of the sum of the components of (A) and (C).

The component of (F) is used in such a rate that the quantity of the functional group of the component of (P) is 0.2–3.0 equivalent mol per carboxyl group existing in the component of (A).

Each rate of the components used in the forth composition. is as follows:
 (1) The rate of the urethane oligomer (A) is 10 or more, more preferably 20% or more, and 90% or less, more preferably 80% or less, further more preferably 70% or less relative to the total mass of the composition.

(2) The rate of the thermoplastic polymer (D) is 5% or more. more preferably 10% or more, further more preferably 20% or more, and 75% or less, more preferably 70% or less relative to the total mass of the composition.

(3) The rate of the photopolymerization initiator (E) are 1 part or more, preferably 2 parts or more, more preferably 4 parts or more, and 20 parts or less, more preferably 15 parts or less relative to 100 parts of the sum of the components of (A) and (D).

If the resin composition is used for the etching resist for a printed circuit board, the component of (F) is preferably not incorporated. However, if the resin composition is used for the soldering resist for a printed circuit board, the component of (F) is incorporated in such a rate that the quantity of the functional group of the component of (F) is 0.2–3.0 equivalent mol per carboxyl group existing in the components of (A) and (D).

Quantity of the carboxyl group existing in the component of (A), (B), or (D) can be determined by the conventional method such as titration method and IR method.

The photosensitive resin composition of the present invention can be prepared by dissolving, mixing, and kneading the above components of (A) to (F) and the various kinds of additives as described above.

The photosensitive film of the present invention can be produced by laminating the layer (the photosensitive layer) of the above photosensitive resin composition of the present invention on a support film.

The process for production thereof is as follows:

The prepared resin composition is coated on the above support film of polymer film uniformly, and is then changed into a dried membrane by heating and/or blowing hot air to remove a solvent. The dried membrane has preferably a thickness of 1–200$\mu$m, more preferably of 50–100$\mu$m, though the thickness is not limited to a special one.

The support includes a polymer film such as the film made of polyethylene terephthalate, polypropylene, or polyethylene. A polyethylene terephthalate film is preferable. The polymer film must be finally removed from the photosensitive layer to separate. Therefore, the polymer film should not be processed unremovably on the surface or be made from unremovable material. The polymer film has preferably a thickness of 5–100$\mu$m, more preferably of 10–30$\mu$m. Two layers of the polymer film can be laminated on the both surfaces of the photosensitive layer in such a way that the one may be used for a support film and another for a protective film. The protective film includes a plastic film such as polyester.

The photosensitive film of the present invention thus obtained, comprising the two layers of the photosensitive layer and the polymer film layer can be stored as it is or in a roll reeled up after a protective film is laminated on another surface of the photosensitive layer.

The resin composition of the present invention may be applied for a coating agent, a printing ink, an adhesive agent, and a make-up material as mentioned above, and can also be used in micro-gel or emulsion. The resin composition is coated on various kinds of base material (such as paper, plastic, metal, and wood) by a method such as comma coating, docter blading, screen-printing, curtain flow coating, and spray coating, and is then cured by the irradiation of an active energetic ray. The active energetic ray includes ultra-violet ray, electron ray, and X ray. The ultra-violet ray irradiates preferably in an amount of 10–10,000 mJ/cm$^2$, and the electrode ray irradiates preferably in an amount of 0.1–100 Mrad.

The resin composition and the photosensitive film of the present invention in the liquid states are useful for an insulating material in the interlayer of electronic parts, and also for the soldering resist ink for a printed substrate. It also can be used for a painting material, a coating agent, and an adhesive agent.

The cured product of the present invention can be obtained by curing the above resin composition or the photosensitive film of the present invention by the irradiation of an energetic ray such as ultra-violet ray. The irradiation of energetic ray such as ultra-violet ray can be carried out by a conventional method. For example, ultra-violet ray can irradiate from an ultra-violet generating device such as a low-pressure mercury lamp, a high-pressure mercury lamp, an ultrahigh-pressure lamp, a xenon lamp, and an ultra-violet ray emitting laser (an excimer laser). The cured product of the present invention obtained from the above resin composition or the photosensitive film can be applied for a permanent resist or an interlayer insulating material for building-up in an electric/electronic part such as a printing board. The layer of the cured product has a membrane thickness of about 1–200 $\mu$m, preferably of 5–100 $\mu$m.

The printed circuit board of the present invention can be obtained as follows for example:

The resin composition of the present invention in liquid is applied to a printing circuit board by a method such as screen printing, spraying, roll coating, electrostatic coating, and curtain coating to form a membrane of the resin composition having a thickness of 5–160 $\mu$m. The membrane is dried at 60–110° C., preferably at 60–100° C. to change into a tackiness-free membrane. Then, a photomask having a formed exposure pattern such as a negative film is contacted directly with the membrane (or put on the membrane without a touch), followed by exposing to ultra-violet ray having a strength of 10–200 mJ/cm$^2$ to form the latent image.

The non-cured region of membrane that has not been exposed to light is developed with a developer by spraying, vibrational dipping, brushing, scrapping for example. The developer includes a halogenide such as trichloroethane; an aromatic hydrocarbon such as toluene and xylene; an ester such as ethyl acetate and butyl acetate; an ether such as 1,4-dioxane and tetrahydrofuran; a ketone such as methyl ethyl ketone and methyl isopropyl ketone; a glycol derivative such as butyl cellosolbe acetate, carbitol acetate, diethylene glycol dimethyl ether, and propylene glycol monomethylether acetate; an alicyclic hydrocarbon such as cyclohexanone and cyclohexanol: a petroleum solvent such as petroleum ether and petroleum naphtha; water; an aqueous solution of alkali such as potassium hydroxide, sodium hydroxide, sodium carbonate, potassium carbonate, sodium phosphate, sodium silicate, ammonia and amines.

Then, the membrane may be irradiated by ultra-violet ray from a low-pressure mercury lamp, a medium-pressure mercury lamp, a high-pressure mercury lamp, an ultrahigh-pressure lamp, a xenon lamp, a metal halide lamp, and an ultra-violet ray emitting laser to cure further if necessary. The membrane is then heated at a temperature of 100–200° C., preferably of 140–18° C. to obtain the printed circuit board having a permanent protective membrane that is excellent in flexibility and is satisfying in property such as heat resistance, solvent resistance, acid resistance, adhesive property, and electrical properties.

A photo resist image can be prepared by using the photosensitive film of the present invention as follows:

The above protective film, if laminated, is beforehand removed. The photosensitive layer can be laminated on a substrate board by press-adhering under heating. The lamination is preferably carried out under reduced pressure. The surface to laminate on is preferably, though not limited to, a FPC on which a circuit is able to form by etching for example. The temperature for heating the photo sensitive layer is preferably, though not limited to, 90–130° C. The pressure for adhering is not limited and the adhering is preferably carried out under a reduced pressure.

The photosensitive layer laminated by the method mentioned above can be exposed to light and developed, followed by photosetting and thermosetting if necessary, to obtain the printed circuit board having a permanent protective membrane that is excellent in flexibility and is satisfying in property such as heat resistance, solvent resistance, acid resistance, adhesive property, and electrical properties.

EXAMPLE

The present invention will be described in more details by way of, though not limited to, the below examples. "part" means "part by mass", unless otherwise stated.

Synthesis Examples of Urethane (Meth)Acrylate (A)

Synthesis Example 1

1,740 g of polytetramethylene glycol (hydroxyl value:129 mgKOH/g, M.W.:870), 218.8 g of pyromellitic acid anhydride(acid value:1,011 mgKOH/g), and 6 g of triethylamine were reacted at 85° C. for 10 hours in a round bottom flask equipped with a stirrer and a cooler to obtain a carboxyl-containing terminal alcohol compound(hydroxyl value: 57 mgKOH/g, acid value: 57 mgKOH/g). 348.4 g of tolylene diisocyanate(a mixture of 2,4-compound and 2,6-compound, same hereinafter)was added to the above product to react at 85° C. for about 15 hours until the isocyanate group fell down to 1.82% in concentration. Then. 239.2 g of 2-hydroxyethyl acrylate and 1.3 g of methoxy phenol were added to react at 85° C. for about 10 hours. The reaction was terminated when the isocyanate fell down to 0.3% in concentration, to obtain a urethane oligomer (A-1) having a weight-average molecular weight of about 6,000 (by the GPC) and an acid value of 44 mgKOH/g.

Synthesis Example 2

A synthesis was carried out as in Synthesis Example 1, but 2,160 g of polytetramethylene glycol, 436.2 g of pyromellitic acid anhydride, 6 g of triethylamine, 348.4 g of tolylene diisocyanate, 239.2 g of 2-hydroxyethyl acrylate and 1.3 g of methoxy phenol were used, to obtain a urethane acrylate (A-2) having a weight-average molecular weight of about 7,500 (by the GPC) and an acid value of 70 mgKOH/g.

Synthesis Example 3

1,000 g of polytetramethylene glycol (hydroxyl value: 112.2 mgKOH/g, M.W.:1,000), 124 g of ethylene glycol, 437.6 g of pyromellitic acid anhydride(acid value: 1,011 mgKOH/g), 10 g of triethylamine and 489 g of carbitol acetate were reacted at 85° C. for 10 hours to obtain a carbitol acetate mixture(hydroxyl value of the solid:71.4 mgKOH/g, acid value: 142.8 mgKOH/g) of the terminal alcohol compound having an average of four carboxyl groups in the molecule, 261 g of tolylene diisocyanate was added to the above product to react at 85° C. for about 15 hours until the isocyanate group fell down to 2.29% in concentration. Then, 122 g of 2-hydroxyethyl acrylate and 1.2 g of p-methoxy phenol were added to react at 85° C. for about 10 hours. The reaction was terminated when the isocyanate fell down to 0.3% in concentration, to obtain the 20% diluted product of an urethane oligomer carbitol acetate (A-3). The solid had an acid value of 115.2 mgKOH/g.

Synthesis Examples of Urethane (Meth)acrylate (A')

Synthesis Example 4

150 g of 6% aqueous triethylamine solution was added dropwise to 100 g of the urethane oligomer (A-1) obtained in Synthesis Example 1 under stirring to obtain a water-soluble urethane oligomer (A'-1) having a weight-average molecular weight of about 6,200 (by the GPC).

Synthesis Example 5

210 g of 6% aqueous triethylamine solution was added dropwise to 100 g of the urethane oligomer (A-2) obtained in Synthesis Example 2 under stirring to obtain a water-soluble urethane oligomer (A'-2) having a weight-average molecular weight of about 7,800 (by the GPC).

Example for Synthesizing an Unsaturated Group-containing Polycarboxylic Acid Resin (B)

Synthesis Example 6

380 parts of a bisphenol F type epoxy compound (epoxy equivalent weight: 950g/eq, softening point: 85° C.) which is shown by Formula (1) wherein X is —$CH_2$— and n (an average degree of polymerization) is 6.2 and 925 parts of epichlorohydrin were dissolved in 462.5 parts of dimethyl sulfoxide, followed by adding 60.9 parts of 98.5% NaOH (1.5 mol) under stirring at 70° C. for 100 minutes. The reaction was carried out at 70° C. for another 3 hours. After the reaction terminated, the reaction solution was washed with 250 parts of water. After the separation of oil and water, the separated oil layer was distilled to recover the most dimethyl sulfoxide and the excessive unreacted epichlorohydrin under reduced pressure and then to remove dimethyl sulfoxide by distillation. The reaction product product containing a by-product salt was dissolved in 750 parts of methyl isobutyl ketone, 10 parts of 30% NaOH was added to the solution, followed by reacting at 70% for 1 hour. After the reaction terminated, the reaction solution was washed twice with 200 parts of water. After the separation of oil and water, the separated oil layer was distilled to recover methyl isobutyl ketone to obtain an epoxy resin (a) having an epoxy equivalent a weight of 310 g/eq. and a softening point of 69° C. By calculation from the epoxy equivalent weight, the epoxy resin (a) thus obtained is that 5 groups of 6.2 alcoholic hydroxyl groups existing in the bisphenol F type epoxy compound for the starting material were epoxydated. 310 parts of the epoxy resin (a) and 251 parts of carbitol acetate were heated at 90° C. under stirring to dissolve. The solution thus obtained was cooled down to 60° C., followed by adding 60 parts of acrylic acid, 97 parts of dimeric acid(acid value: 196 mgKOH/g), 0.8 parts of methylhydroquinone, and 2.5 parts of triphenyl phosphine to dissolve by heating at 80° C. and then reacting at 98° C. for 35 hours to obtain an epoxy acrylate having an acid value of 0.5 mgKOH/g and a solid rate of 65%.

Then, 718.5 parts of the epoxy acrylate, 100 parts of succinic anhydride and 54 parts of carbitol acetate were reacted at 90° C. for 6 hours to obtain an unsaturated group-containing polycarboxylic acid resin (B-1) having an acid value in solid of 99 mgKOH/g and a solid rate of 65%.

Example for synthesizing a thermoplastic polymer (D)

Synthesis Example 7

121.5 g of the solution having a methylcellosolve/toluene ratio by weight of 3/2 was set in a flask, and heated up to 85° C. to leave for 1 hour. A solution of 13.5 g of methacrylic acid, 46.8 g of methyl methacrylate, 38.2 g of ethyl acrylate, 3.2 g of 2-hydroxyethyl methacrylate, 1.5 g of 2-ethylhexyl acrylate, 0.17 g of azobisisobutylonitrile, 18.7 g of methylcellosolve and 12.5 g of toluene was added dropwise for 4 hours to react. Then, 7.1 g of methylcellosolve was added to keep warming for 2 hours. A solution of 0.6 g of methacrylic acid, 0.54 g of azobisisobutylonitrile, 2.9 g of methylcellosolve and 1.9 g of toluene was added to keep warming for another 2 hours. Then, a solution of 0.024 g of azobisisobutylonitrile dissolved in 1.2 g of methylcellosolve was added to keep warming for 5 hours. 0.01 g of hydroquinone was added to the reaction solution, followed by cooling to obtain a carboxyl group-containing thermoplastic polymer (D-1) having an average molecular weight of 84,000, an unvolatile matter rate of 38.5% by weight, and a acid value in solid of 85 mgKOH/g.

Example 1 to 4 and Comparative Example 1

The resin compositions were prepared according to their respective constitutions as shown in Table 1 to assay them on water solubility. The obtained resin compositions were each applied to the surfaces of 188 μm highly adhesive PET films by a guide so that their membranes might have a thickness of 10 μm, and were irradiated at 200 mJ/cm$^2$ to obtain their cured membranes.

The cured membranes were assayed on curing, adhesion, pencil hardness, and water resistance to show on Table 1.

(1) Curing: tackiness was determined by finger touching.
  ○: no tackiness
  Δ: a little tackiness
  X: a great tackiness
(2) Adhesion: a net matrix having a hundred of 1 mm squares was prepared on a test piece according to the JIS K5400 to carry out a peeling test with a cellophane tape. Bach square was observed to determine whether it was peeled or not. Adhesion was assayed depending on the number of squares that were not peeled.
  ○: 100/100
  Δ: 50/100 to 90/100
  X: 0/100 to 50/100
(3) Pencil hardness: the assay was carried out according to the JIS K5400.
(4) Water resistance: a test piece was dipped in water at a room temperature for 24 hours to determine whether it appeared normal or not, and further to carry out a peeling test with a cellophane tape. Water resistance was assayed depending on the below observations
  ○: an applied membrane did not appear abnormal, and further did not swell nor peel.
  X: an applied membrane swelled or peeled.
(5) Water solubility of a resin composition: 100 parts of an aqueous 1% sodium carbonate solution was added to 100 parts of each of the resin compositions of Example 1 and Example 2 to stir, resulting in dissolving uniformly, 100 parts of water was added to 100 parts of each of the resin compositions of Example 3 and Example 4 to stir, resulting in dissolving uniformly. On the other hand, 100 parts of an aqueous 1% sodium carbonate solution or water was added to 100 parts of the resin composition of Comparative Example to stir, resulting in undissolving to separate.
  ○: dissolving in (alkali) water
  X: undissolving in (alkali) water

TABLE 1

|  | Example | | | | Comparative |
| --- | --- | --- | --- | --- | --- |
|  | 1 | 2 | 3 | 4 | Example 1 |
| Urethane oligomer (A-1) | 70 | | | | |
| Urethane oligomer (A-2) | | 70 | | | |
| Urethane oligomer (A'-1) | | | 175 | | |
| Urethane oligomer (A'-2) | | | | 218 | |
| KAYARAD UX-6101 *1) | | | | | 70 |
| KAYARAD PEG400DA *2) | 20 | | 30 | 15 | 20 |
| KAYARAD R-167 *3) | 10 | | | | 10 |
| KAYARAD TMPTA *4) | | 15 | | 10 | |
| Acryloyl morphorine | | 15 | | 5 | |
| Darocure1173 *5) | 1 | 1 | 1 | 1 | 1 |
| (1) Curing | ○ | ○ | ○ | ○ | ○ |
| (2) Adhesion | ○ | ○ | ○ | ○ | ○ |
| (3) Pencil hardness | H | H | HB | HB | H |
| (4) Water resistance | ○ | ○ | ○ | ○ | ○ |
| (5) Water solubility | ○ | ○ | ○ | ○ | X |

(Note)
*1): Urethane acrylate (made by NIPPON KAYAKU KK)
*2): Polyethylene glycol diacrylate (made by NIPPON KAYAKU KK)
*3): 1,6-hexane diol diglycidyl ether diacrylate (made by NIPPON KAYAKU KK)
*4): trimethylol propane triacrylate (made by NIPPON KAYAKU KK)
*5): 2-hydroxy-2-methyl-1-phenyl-propane-1-one (made by Ciba Speciality Chemicals KK)

The results of Example 1 to 4 and Comparative Example 1 reveal that the resin compositions of the present invention can be diluted with water and are excellent in curing-property.

Example 5 to 20 and Comparative Example 2 to 5

The components were mixed at the rates as shown in Table 2 and blended by a three-roll mill to prepare the principal agents {formulation components (XA-1)–(XA-5) and (XX-1)–(XX-2)}. On the other hand, the thermosetting components (F) (the epoxy resins) were used at the rates as shown in Table 3 for the curing agents {formulation components (H-1)–(H-4)}. The above principal agents and the curing agents were mixed at the combinations as shown in Table 4 to prepare the soldering resist compositions for use.

TABLE 2

| | Formulation Component | | | | | | |
| --- | --- | --- | --- | --- | --- | --- | --- |
| Principal agent | XA-1 | XA-2 | XA-3 | XA-4 | XA-5 | XX-1 | XX-2 |
| A-1 | 30 | 20 | 15 | | | | |
| A-3 | | | | 125 | | | |
| B-1 | 108 | 123 | 131 | | | 75 | 154 |
| D-1 | | | | | 105.3 | | 105.3 |
| KAYARAD DPHA *6 | 16 | 16 | 16 | 16 | | 16 | |
| KAYARAD DPCA-60 *7 | | | | | 20 | | 60 |
| I907 *8 | 10 | 10 | 10 | 10 | | 10 | |
| DETX-S *9 | 1.2 | 1.2 | 1.2 | 1.2 | | 1.2 | |
| Diethylaminobenzophenone | | | | | 0.1 | | 0.1 |
| Benzophenone | | | | | 5.0 | | 5.0 |
| Victoria Pure Blue | | | | | 0.2 | | 0.2 |
| Fine silica | 10 | 10 | 10 | 10 | | 10 | |
| Melamine monomer | 1.2 | 1.2 | 1.2 | 1.2 | | 1.2 | |

TABLE 2-continued

| | Formulation Component | | | | | | |
|---|---|---|---|---|---|---|---|
| Principal agent | XA-1 | XA-2 | XA-3 | XA-4 | XA-5 | XX-1 | XX-2 |
| Hexamethoxy melamine | | | | | | 10 | 10 |
| KS-66 *10 | 1.0 | 1.0 | 1.0 | 1.0 | | 1.0 | |
| MEK | | | | | | 45 | 45 |

(Note)
*6: Dipentaerythritol(penta and hexa)acrylate mixture
*7: Dipentaerythritol-ε-caprolactone additive polyacrylate
*8: Irgacure907:2-methyl-1-[4-(methylthio)phenyl-2-morpholino-propan-1-one] made by Ciba Geigy
*9: Diethylthioxanthone made by NIPPON KAYAKU KK
*10: A silicone antifoamer made by Shin-Etsu Chemicals KK

TABLE 3

| | Formulation Component (parts by weight) | | | | |
|---|---|---|---|---|---|
| | | H-1 | H-2 | H-3 | H-4 |
| Epicoat1001 | *1 | 66 | 30 | | |
| YR-528 | *2 | | 20 | | |
| YX-4000 | *3 | | | 30 | |
| DEN-438 | *4 | | | | 30 |

(Note)
*1: Epicoat1001: Bisphenol A epoxy resin (containing carbitol acetate, a solid concentration of 75%) made by Yuka Shell Epoxy KK
*2: YR-528: a gum denatured epoxy resin made by Tohto Kasei KK
*3: YX-4000: a bisphenol type epoxy resin made by Yuka Shell Epoxy KK
*4: DEN-438: a phenol novolac epoxy resin made by Dow Chemical Co., Ltd Assay Method:

The resist compositions were each assayed as follows.

The resist compositions of examples and comparative examples as shown in Table 4 were each applied to the printed circuit substrates (obtained by laminating copper foil on an amide film) by screen printing to dry at 80° C. for 20 minutes. Then, the applied membranes were each covered with the negative films and irradiated by an integrated dose of 500 mJ/cm$^2$ of ultra-violet ray from an exposure device to form certain patterns. The membranes were developed with an organic solvent or an aqueous 1 wt % Na$_2$CO$_3$ solution and heated at 150° C. for 50 minutes to cure. The substrates thus prepared for test were assayed on the properties in alkali development, to soldering-heat resistance, flexibility, beat-deterioration resistance and nonelectrolytic gold-plating resistance. The results are shown in Table 4. The assay methods and the assay standards were as follows:

(1) Development:

The applied membrane was dried at 80° C. for 60 minutes, followed by spraying an aqueous 1 sodium carbonate solution of 30° C. for developing to assay the development.
    ○: no visual residue
    X: a visual residue (2) Soldering-heat resistance:

A rosin flux was applied to the test substrate, which was dipped in a melted solder bath of 260° C. for 10 seconds. The cured membrane was observed to determine whether it was peeled by a cellophane adhesive tape to get a trouble or not.
    ○: no trouble
    X: a peeling trouble (3) Flexibility:

The test substrate was assayed to determine whether it was folded at a bend angle of 180° to get a crevice or not.
    ○: no crevice
    Δ: a little crevice
    X: a crevice with the cured membrane peeled along the fold line (4) Heat-deterioration resistance:

The test substrate was left at 125° C. for 5 days, and assayed to determine whether it was folded at a bend angle of 180° to get a crevice or not.
    ○: no crevice
    Δ: a little crevice
    X: a crevice with the cured membrane peeled along the fold line (5) Nonelectrolytic gold-plating resistance:

A gold plating as described below was applied to the test substrate. The gold plating was observed to determine whether it was peeled by a cellophane adhesive tape to get a trouble or not.
    ○: no trouble
    Δ: a little peeling trouble
    X: no peeling trouble Nonelectrolytic Gold-plating;

The test substrate was dipped in an acidic defeating solution (the aqueous 20 vol % MetexL-5B solution made by Nihon MacDermid KK) of 30° C. for 3 minutes to defat, and was then dipped in a D3 stream of water for 3 minutes to wash. The test substrate was dipped in an aqueous 14.3 wt % ammonium peroxodisulfate solution at a room temperature for 3 minutes to soft etch, and was then dipped in a stream of water for 3 minutes to wash. The test substrate was dipped in an aqueous 10 vol % sulfuric acid solution at a room temperature for 1 minute, and was then dipped in a stream of water for 30 seconds–1 minute to wash. The test substrate was dipped in a catalyst solution (an aqueous 10 vol % metal plate-activator 350 solution made by Meltex KK) of 30° C. for 7 minutes to furnish the substrate with the catalyst, and was then dipped in a stream of water for 3 minutes to wash. The test substrate furnished with the catalyst was dipped in a nickel plating solution (an aqueous 20 vol %; pH 4.6) of 85° C. for 20 minutes to complete an nonelectrolytic nickel-plating. The test substrate was dipped in an aqueous 10 vol % sulfuric acid solution at a room temperature for 1 minute, and was then dipped in a stream of water for 30 seconds–1 minute to wash. Then, the test substrate was dipped in a gold plating solution (an aqueous 15 vol % aurolectroless UP and 3 vol % potassium gold cyanide solution made by Meltex KK; pH 6) of 95° C. for 10 minutes to complete an nonelectrolytic gold-plating. The test substrate was then dipped in a stream of water for 3 minutes to wash and was dipped in 60° C. hot water for 3 minutes to wash. The test substrate was washed sufficiently, drained, and dried to prepare the nonelectrolytic gold-plated test substrate.

TABLE 4

| | Example | | | |
|---|---|---|---|---|
| | 5 | 6 | 7 | 8 |
| Component (X) | XA-1 | XA-1 | XA-1 | XA-1 |
| Component (H) | H-1 | H-2 | H-3 | H-4 |
| Development | ○ | ○ | ○ | ○ |
| Soldering-heat resistance | ○ | ○ | ○ | ○ |
| Flexibility | ○ | ○ | ○ | ○ |
| Heat-deterioration resistance | ○ | ○ | ○ | ○ |
| Nonelectrolytic gold-plating resistance | ○ | ○ | ○ | ○ |

TABLE 4-continued

| | Example | | | |
|---|---|---|---|---|
| | 9 | 10 | 11 | 12 |
| Component (X) | XA-2 | XA-2 | XA-2 | XA-2 |
| Component (H) | H-1 | H-2 | H-3 | H-4 |
| Development | ○ | ○ | ○ | ○ |
| Soldering-heat resistance | ○ | ○ | ○ | ○ |
| Flexibility | ○ | ○ | ○ | ○ |
| Heat-deterioration resistance | ○ | ○ | ○ | ○ |
| Nonelectrolytic gold-plating resistance | ○ | ○ | ○ | ○ |

| | Example | | | |
|---|---|---|---|---|
| | 13 | 14 | 15 | 16 |
| Component (X) | XA-3 | XA-3 | XA-3 | XA-3 |
| Component (H) | H-1 | H-2 | H-3 | H-4 |
| Development | ○ | ○ | ○ | ○ |
| Soldering-heat resistance | ○ | ○ | ○ | ○ |
| Flexibility | ○ | ○ | ○ | ○ |
| Heat-deterioration resistance | ○ | ○ | ○ | ○ |
| Nonelectrolytic gold-plating resistance | ○ | ○ | ○ | ○ |

| | Example | | | |
|---|---|---|---|---|
| | 17 | 18 | 19 | 20 |
| Component (X) | XA-4 | XA-4 | XA-4 | XA-4 |
| Component (H) | H-1 | H-2 | H-3 | H-4 |
| Development | ○ | ○ | ○ | ○ |
| Soldering-heat resistance | ○ | ○ | ○ | ○ |
| Flexibility | ○ | ○ | ○ | ○ |
| Heat-deterioration resistance | ○ | ○ | ○ | ○ |
| Nonelectrolytic gold-plating resistance | ○ | ○ | ○ | ○ |

| | Comparative Example | | | |
|---|---|---|---|---|
| | 2 | 3 | 4 | 5 |
| Component (X) | XX-1 | XX-1 | XX-1 | XX-1 |
| Component (H) | H-1 | H-2 | H-3 | H-4 |
| Development | ○ | ○ | ○ | ○ |
| Soldering-heat resistance | ○ | ○ | ○ | ○ |
| Flexibility | Δ | Δ | X | X |
| Heat-deterioration resistance | Δ | Δ | X | X |
| Nonelectrolytic gold-plating resistance | ○ | ○ | ○ | ○ |

The results of Example 5–20 and Comparative Example 2–5 reveal that the resin compositions of the present invention allow a good alkali development and can provide a cured membrane that is excellent in soldering-heat resistance, flexibility, heat-deterioration resistance, and non-electrolytic gold-plating.

Example 21 and Comparative Example 6

(XA-5) and (XX-2) were each applied to a polyethylene terephthalate films having a thickness of 25 μm uniformly and dried to remove solvent. The dried photosensitive layers had a thickness of 50 μm. Then, each of the photosensitive layers was covered with a polyethylene film for the protective film to prepare a photosensitive laminated product.

A substrate for FPC (Trade name:F30VC125RC11, made by Nikkan Kogyo KK) obtained by laminating a 35 μm thick copper foil on a polyimide base material was polished with a whetting brush, washed with water, and dried. The said photosensitive film was laminated on the above substrate (23° C.) by a vacuum laminator.

The sample thus obtained was exposed to light at 200 mJ/cm$^2$ by using the Stoffer's step tablet of 21 steps and a straight line of negative film having a line/space of 150 μm/150 μm, and was left at a room temperature for 30 minutes. The sample was developed by spraying an aqueous 1% sodium carbonate solution at 30° C. for 100 seconds. The number of remaining steps in the step tablet was counted. The results are shown in Table 5. Further, the sample was heated at 150° C. for 45 minutes and exposed to ultra-violet ray at 3 J/cm$^2$ to prepare a cover lay.

The cover lay sample was assayed on flexibility to determine whether it was folded at a bend angle of 180° C. to get a cracking trouble or not. The sample was assayed on soldering-heat resistance to determine whether it was soldered at 260° C. for 10 seconds by the rosin type crack MH-820V (trade name, made by Tamura Kaken KK) to get a swelling trouble or not. The sample after soldering was again assayed on flexibility to determine whether it was folded at a bend angle of 180° to get a cracking trouble or not. The results are shown in Table 5.

TABLE 5

| | The number of remaining steps | Soldering heat resistance (260° C., 10 sec) | Folding (180°) | |
|---|---|---|---|---|
| | | | before soldering | after soldering |
| Example 21 | 9 | good | good | good |
| Comparative Example 6 | 8 | good | cracking | cracking |

The results of Example 21 and Comparative Example 6 reveal that the photosensitive resin composition of the present invention can provide a cover lay that is good in both soldering-heat resistance and folding (flexibility).

Industrial Applicability

The resin composition of the present invention can be diluted with water and is excellent in curing-physical property (curing, adhesion, pencil hardness, and water resistance). The resin composition is suitable for a solder resist and an interlayer dielectric layer, because it allows a development with an organic solvent or a dilute alkali solution and the cured product is excellent in flexibility, soldering-heat, resistance, heat-deterioration resistance and nonelectrolytic gold-plating resistance. The resin composition is suitable for a solder resist for a printed circuit board, especially a flexible printed circuit board and an interlayer dielectric layer. Furthermore, the photosensitive resin composition and the photosensitive film of the present invention are suitable for the etching resist for PPC or the photosensitive film for a cover lay, because they are good to deal with and have excellent flexibility and soldering-heat resistance.

What is claimed is:

1. A resin conposition comprising a urethane oligomer (A) or the salt thereof, wherein the urethane oligomer (A) or the salt thereof is produced by reacting a polyol compound (a) with a polybasic acid anhydride (b-1) having at least two acid anhydride groups per molecule to produce a terminal alcohol compound having at least two carboxyl groups, subsequently reacting the terminal alcohol compound with a polyisocyanate compound (c) to form a carboxyl group-contain terminal isocyanate urethane prepolymer and reacting said urethane prepolymer with a hydroxy compound having ethylenically unsaturated groups, and an unsaturated group-containing polycarboxylic acid resin (B) that is a product obtained by reacting an epoxy resin (e) having at least two epoxy groups per molecule with a monocarboxylic acid compound (f) having ethylenically unsaturated groups and a polybasic acid anhydride (b-2).

2. A resin composition according to claim 1, wherein said epoxy resin (e) having at least two epoxy groups per molecule is represented by the Formula (1):

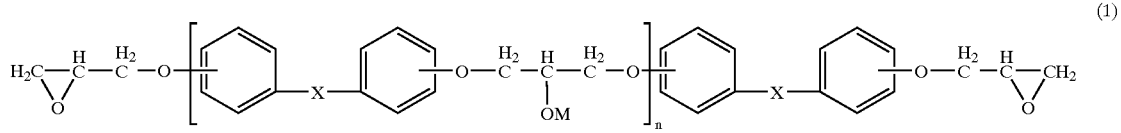

(1)

(In the formula, X is —$CH_2$— or —$C(CH_3)_2$—, n is an integer of 1 or more, and M is hydrogen or a group represented by Formula (G) as shown below:

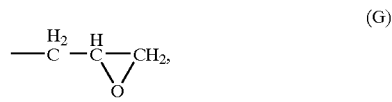

(G)

provided that M is a group represented by Formula (G) if n is 1, while at least one M is a group represented by Formula (G) and each of the remainders being hydrogen if n is an integer of more than 1).

3. A resin composition comprising a urethane oligomer (A) according to claim 1 and a thermoplastic polymer (D).

4. A resin composition according to claim 1, comprising a diluent (C).

5. A resin composition according to claim 1, further comprising a diluent (C), and wherein said diluent (C) is a reactive diluent (C-1).

6. A resin composition according to claim 1 comprising a photopolymerization initiator (E).

7. A resin composition comprising a urethane oligomer (A) according to claim 1, a thermoplastic polymer (D) and a photopolymerization initiator (E).

8. A resin composition according to claim 7, wherein said thermoplastic polymer (D) is a polymer having carboxyl groups.

9. A resin composition according to claim 1 comprising a thermoplastic component (F).

10. A resin composition according to claim 1, wherein said resin composition is prepared for the solder resist in a printed circuit board or for an interlayer dielectric layer.

11. A photosensitive film comprising being prepared by laminating the layer of a resin composition according to claim 1 on a supporting film.

12. A photosensitive film according to claim 11, wherein said photosensitive film is prepared for a printed circuit board.

13. A cured product of the resin composition according to claim 1.

14. An article comprising the layer of a cured product according to claim 13.

15. An article according to claim 14, wherein said article is a printed circuit board.

* * * * *